United States Patent [19]
Verga

[11] Patent Number: 5,627,872
[45] Date of Patent: May 6, 1997

[54] STATIONARY EXIT WINDOW FOR X-RAY LITHOGRAPHY BEAMLINE

[75] Inventor: John Verga, Rockville Centre, N.Y.

[73] Assignee: Northrop Grumman Corporation, Los Angeles, Calif.

[21] Appl. No.: 383,268

[22] Filed: Feb. 3, 1995

[51] Int. Cl.⁶ .................................................. G21K 1/00
[52] U.S. Cl. .............................. 378/161; 378/145; 378/34
[58] Field of Search ........................... 378/161, 34

[56] References Cited

U.S. PATENT DOCUMENTS

| | | | |
|---|---|---|---|
| 3,973,120 | 8/1976 | Kessels | 378/161 |
| 4,852,133 | 7/1989 | Ikeda et al. | |
| 4,899,354 | 2/1990 | Reinhold | |
| 5,001,437 | 3/1991 | Miyata et al. | |
| 5,031,199 | 7/1991 | Cole, III et al. | |
| 5,073,913 | 12/1991 | Martin | |
| 5,159,621 | 10/1992 | Watanable et al. | 378/161 |

FOREIGN PATENT DOCUMENTS

| | | | |
|---|---|---|---|
| 1-211899 | 8/1989 | Japan | 378/161 |

OTHER PUBLICATIONS

Brodsky (1988) "The Mechanical Design of Thin Beryllium Windows for Synchrotron Radiation," *Nuclear Instruments and Methods in Physics Research* A266:358–361 no month.

Kovacs, et al. (1990) "Optimizing a synchrotron based X-ray lithography system for IC manufacturing," *SPIE* 1263:140–150 no month.

Kovacs, et al. (1991) "System design considerations for a production grade ESR-based X-ray lithography beamline," *SPIE* 1465:88–99 no month.

*Primary Examiner*—Craig E. Church
*Attorney, Agent, or Firm*—Terry J. Anderson; Karl J. Hoch, Jr.

[57] ABSTRACT

A stationary exit window for an X-ray lithography beamline having a shape and thickness such that the exit window can withstand a pressure differential of 14.7 psi and allows an X-ray beam as passed through the window to have X-rays above and below a desired energy band substantially attenuated. The exit window includes a thin material having a window section disposed within an opening of a frame. The window section has a cylindrical sector shape to capitalize on the pressure load bearing ability of hoop stress to keep the thin material from tearing apart. A method of scanning the X-ray beam through a stationary exit window and onto an exposure field on a wafer is also disclosed.

10 Claims, 3 Drawing Sheets

STATIONARY EXIT WINDOW FOR X-RAY LITHOGRAPHY BEAMLINE

BACKGROUND OF THE INVENTION

1. Field of the Invention

The present invention relates generally to an exit window for an X-ray lithography beamline, and more particularly, to a thin, cylindrically shaped beryllium exit window that is attenuating and can resist a vacuum pressure differential of at least 14.7 psi. The hoop stress effect makes it possible for the thin foil to be wide enough to accommodate the full scan of the lithography beam as a stationary window.

2. Description of the Prior Art

Since the first planar transistor was fabricated in the late 1950's the number of transistors on integrated circuits have doubled every year. The driving force behind this growth has been the ever increasing demand for higher speed communication in ever increasing chip sizes. The continuously increasing production and resolution requirements for manufacturing semiconductor devices will lead to performing microlithographic operations on 8–10 inch diameter wafers producing lithographed lines with 0.25 micron resolution in the mid 1990s. To meet the demands, these operations should be performed at a high production rate level, i.e., 30 to 60 wafers per hour per beamline. Although electron beam and focused ion beam techniques can meet critical dimension requirements, their low production rates make them unsuitable for high rate production. X-ray lithography was successfully utilized in 1989 to demonstrate the fabrication of functional NMOS and CMOS circuits with fully scaled 0.5 micron ground rules. The utilization of an electron storage ring (ESR) as the X-ray source, with its highly collimated X-ray flux at high intensity levels that can be delivered to many ports, has the necessary properties to satisfy both resolution and production volume needs of the future.

The major subunits of an ESR based X-ray lithography system (XLS) include a preaccelerator, beam transport line, electron storage ring (synchrotron), lithography beamlines and exposure stations (aligner/stepper), where the actual lithography takes place. The lithography beamline performs a specialized role in the lithography system in that it connects the source to the lithography station. One basic ESR XLS performance requirement is to support 0.25 micron resolution lithography with the given stepper. One of the resolution related optical parameters is the lithography exposure window. The elements that form the exposure window in the beamline and the stepper include mirrors, filters and an exit window. The function of the exit window is to separate the beamline from the stepper (lithography chamber) and contribute to the formation of the exposure window. The lithography beamline connects the synchrotron to the exposure chamber. The beamline operates at an ultra high vacuum (UHV) while the exposure chamber operates at atmospheric pressure. In order to ensure the vacuum integrity of the beamline, the exit window must be able to withstand this pressure differential. The window material must also be transmissive to a desirable beam energy. This means the exit window material must behave as a high pass filter by providing minimum attenuation in that portion of the spectrum which is required for lithography, i.e. 800–1800 eV range, and maximum cutoff in the low energy interval of radiation. This absorption can be minimized with properly selected window materials and optimized material thickness. Beryllium is one of the possible exit window materials. The ideal window will have minimum power absorption in the exposure spectrum range and, therefore, minimum thickness. However, this minimum thickness will not be able to withhold the 1 Kg/cm$^2$ atmospheric pressure differential. It is clear that the power transmission and the mechanical strength of the window are competing factors that must be optimized.

One basic future production lithography requirement dictates the manufacture of larger chip sizes with horizontal and vertical dimensions of 50 mm by 25 mm or larger. This defines the area to be illuminated with X-rays. The most practical way currently known in the prior art is to generate a "flat" (a few mm in the vertical dimension) X-ray beam with the required width (50 mm or wider) and to scan this beam over the field or move the wafer relative to the beam. This scanning type exit window is slightly larger than the beam cross section and it is synchronously moved with the scanning beam. The scanning exit window can be comprised of a flat beryllium sheet 4 mm×60 mm and 18 microns thick and will withstand the required pressure differential as well as be transmissive to the desired beam energy. However, the scanning exit window is a complicated subsystem of the beamline and makes the fabrication of the beamline expensive and its operation difficult. In addition, scanning the beam introduces difficulties in the optics of the lithography beamline including mechanical movement that generates uncompensated vibration. Further disadvantages include fatigue of connecting bellows which may trigger a major vacuum accident, higher thermal density load requiring additional cooling and an additional control system is required. Thus, there is a need to develop a stationary exit window that meets the requirements of pressure differential and beam energy transmission.

Furthermore, there is a need to develop a stationary window that eliminates the need for moving parts and that is easier and less costly to maintain.

SUMMARY OF THE INVENTION

The present invention is directed to an exit window for an X-ray lithography beamline having a cylindrical shape and of a thickness such that the exit window can withstand a pressure differential of at least 14.7 psi (1 atmosphere) between the ultra high vacuum of the X-ray lithography beamline and the pressure within the exposure chamber. In addition, the shape and thickness of the exit window are optimized so that the window is transmissive to X-rays within a desired energy band, typically between 800 eV and 1800 eV. The present invention allows the exit window to have an opening large enough to cover the full exposure field on a wafer in the exposure chamber. In contrast to prior art exit windows which require a scanning exit window, the present invention allows a stationary exit window to be utilized.

The cylindrical exit window of the present invention includes a frame for securely mounting the exit window. The frame has an opening that can be equal to the size of an exposure field on the wafer. The exit window is comprised of a thin material laid over to close the opening of the frame. The window section is exposed to the X-ray beam emitted from the beamline and is preferably formed of beryllium having a thickness between 16 and 25 microns.

By utilizing an exit window having a cross section that can be equal to the exposure field on the wafer, the exit window can be stationary. This has the advantage in that no mechanical movement is required. Alternatively, the cross section of the window can be made just to cover the cross section of the X-ray emitted from the beamline, in which case, the exit window has to be synchronously scanned with the X-ray beam.

The frame consists of first and second tube-shaped members each having an opening that is preferably rectangular and approximately equal to the exposure field on the wafer. A suitable bonding agent is used to secure the periphery of the window to the frame members so that a vacuum seal is created within the first frame member completely surrounding the opening and abutting a part of the thin material sandwiched between the first and second frame members.

The present invention is also directed to a method of scanning the X-ray beam emitted from the beamline onto the exposure field of the wafer. The first step is to position a stationary exit window having an opening that is approximately equal to the exposure field between the beamline and the wafer. The exit window has a cylindrical shape and thickness that can withstand a pressure differential of at least 14.7 psi and is transmissive to the desirable energy band. Next, a vacuum is created within the beamline such that there is a pressure differential of at least 14.7 psi between the beamline and an exposure chamber containing the wafer. The X-ray beam is scanned up and down between first and second positions such that the X-ray beam passes through the exit window and is scanned over the entire exposure field on the wafer. The X-ray beam as passed through the exit window has X-rays above and below a desired energy band substantially attenuated.

DETAILED DESCRIPTION OF THE INVENTION

The continuously increasing production and resolution requirements for manufacturing semiconductor devices has led to the development of an electron storage ring (ESR) based X-ray lithography system (XLS). The major subunits of an ESR based XLS include a preaccelerator, beam transport line, electron storage ring (synchrotron), lithography beamlines and exposure stations (aligner/stepper). A typical beamline for an XLS is described in U.S. Pat. No. 5,031,199 the specification of which is hereby incorporated by reference thereto. One basic ESR XLS performance requirement is to support 0.25–0.10 micron lithography resolution with a given stepper. One of the resolution related optical parameters is the lithography exposure window. The elements that form the exposure window in the beamline and the stepper include mirrors, filters and an exit window.

One of the functions of the exit window is to separate the beamline from the stepper (lithography chamber) and contribute to the formation of the exposure window. The beamline connects the synchrotron to the exposure chamber where the actual lithography takes place. The beamline operates at an ultra high vacuum (UHV) while the exposure chamber operates at about 760 mm Hg (atmospheric pressure). In order to ensure the vacuum integrity of the beamline, the exit window must be able to withstand at least this pressure differential. Thus, the foil is designed so that it functions as a pressure vessel so that the maximum induced stress is the circumferential or hoop stress. In addition, the material of the window must be transmissive to that portion of the spectrum which is required for lithography (between 800 eV and 1800 eV) and substantially attenuate X-rays above and below the desired energy band. Moreover, the effects on the X-ray beam power uniformity of the X-ray beam passing through the exit window must be considered. A high performance ESR based XLS requires that the power uniformity in the beam be 95% or better.

Figure 1:
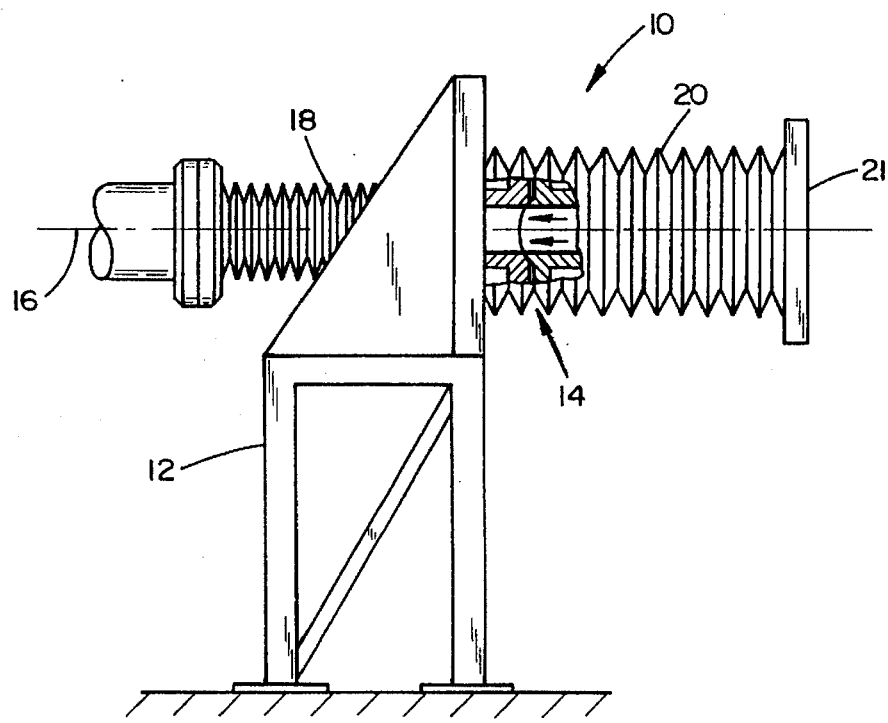
FIG. 1 is a schematic drawing in partial cross-section of a stationary exit window assembly in accordance with the present invention.

The exit window of the present invention achieves all of the above requirements. Referring now to FIG. 1, there is shown a stationary exit window assembly 10 which can be utilized in accordance with the present invention. The assembly 10 includes a support structure 12 to support exit window 14. An X-ray beam 16 travels in the direction shown, from the beamline (not shown) through exit window 14 and finally to the stepper or exposure chamber housing wafer field 21. Bellows 18 are provided to maintain the pressure in the beamline at an ultra high vacuum and bellows 20 are provided to maintain the pressure in the exposure chamber, indicated by the arrows in FIG. 1, at atmospheric pressure.

Figure 2A:
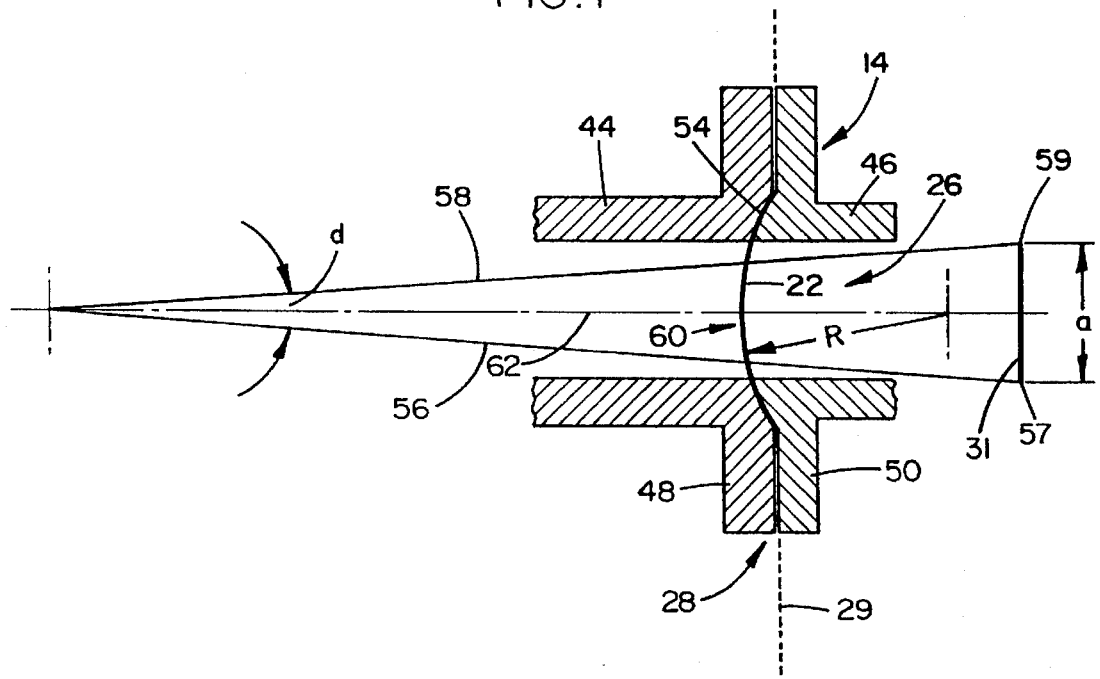
FIG. 2(a) is a cross-sectional view of the stationary exit window of FIG. 1.
Figure 3:
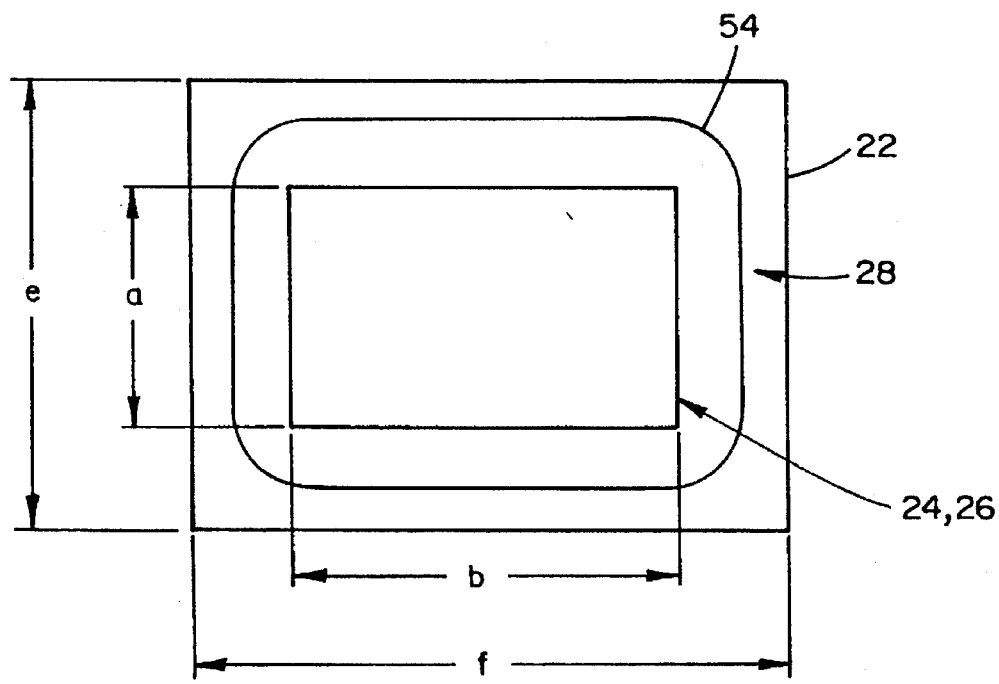
FIG. 3 is a front view of the exit window of FIG. 1.

Referring now to FIGS. 2(a) and 3 there is shown respective cross-sectional and front view of the exit window assembly 14 of the present invention. The window 14 includes a thin material 22 having a window section 24 disposed within an opening 26 of a frame 28. The window of thin material may be of a semi-spherical or cylindrical configuration, but, in the preferred embodiment, defines a cylindrical sector having a radius of curvature R dictated according to the formula of equation (1):

$$R = st/P \qquad 1)$$

where R is the radius of curvature of the cylindrical staionary exit window 24, s is the allowable circumferential or hoop stress, in psi, t is the thickness of the foil in inches, and, P is the intended pressure in psi, usually 14.7 psi. A shape of the thin window other than a surface of revolution (spherical or cylindrical) may tear the thin foil due to localized stress levels greater than the hoop stress when subject to the pressure differential levels discussed herein. Thus, R would be limited by the allowable circumferential or hoop stress. As an example, the ultimate hoop stress in a beryllium foil is 55 Ksi. Therefore, a cylindrical sector foil having a thickness of 18 microns and designed with a safety margin corresponding to a hoop stress of 30 Ksi, will have a radius of curvature of approximately 1.42 inches. As shown in FIG. 2(a), frame 28 is provided to securely mount or fasten the thin material 22 in place. The frame 28 consists of first and second frame members 44, 46 each having a complementary cylindrical surface with an opening that is preferably rectangular and equal to the exposure field on the wafer. It should be understood by those skilled in the art that other shapes, can be utilized, however. Each of members 44, 46 may be machined from tube stock. The dotted lines 29 shown in FIG. 2(a) represent the separation between the frame members 44,46 and the delineation of the beamline from and the exposure chamber.

Figure 2B:
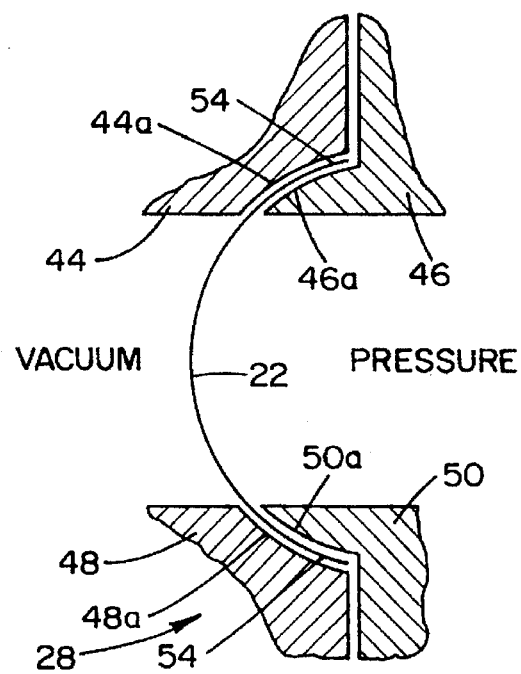
FIG. 2(b) is a detailed view of the frame supports of the support fixture for supporting the stationary exit window shown in FIG. 2.

As shown in detail in the FIG. 2(b), frame support member 46 includes a partial cylindrical surface 46a and frame support shoulder 50 also includes a partial cylindrical surface 50a, both surfaces for accommodating the peripheral edges of the cylindrical thin foil 22. Surfaces 46a and 50a are of the same radius of curvature as the thin foil. The provision of cylindrical frame support surfaces is to minimize the stress levels at the foil edges when the vacuum from the beamline pulls the foil. Appropriate adhesive or gasketing seal (not shown) may be applied to bond the foil to the frame 28. Additionally, as shown in FIG. 2(b), frame member 44 and shoulder 48 are provided with complementary circumferential surfaces 44a and 48a respectively, for accommodating the peripheral edges of the thin foil 22. It should be understood that all curved surfaces 44a, 46a, 48a and 50a edges of the frame 28 may be sand blasted or similarly textured prior to mounting thin foil 22 thereto with appropriate bonding agents to further prevent or minimize any vacuum leakage. As shown in FIGS. 2(a)–2(b) and mentioned briefly above, the seal 54 is positioned between members 44 and 46 to abut the peripheral edges of the thin material 22 sandwiched therebetween in order to seal the UHV of the beamline from the atmospheric pressure in the exposure chamber. The seal 54 completely surrounds the opening 26 and can be a gasket or pressure seal ring formed of soft aluminum.

Figure 4:
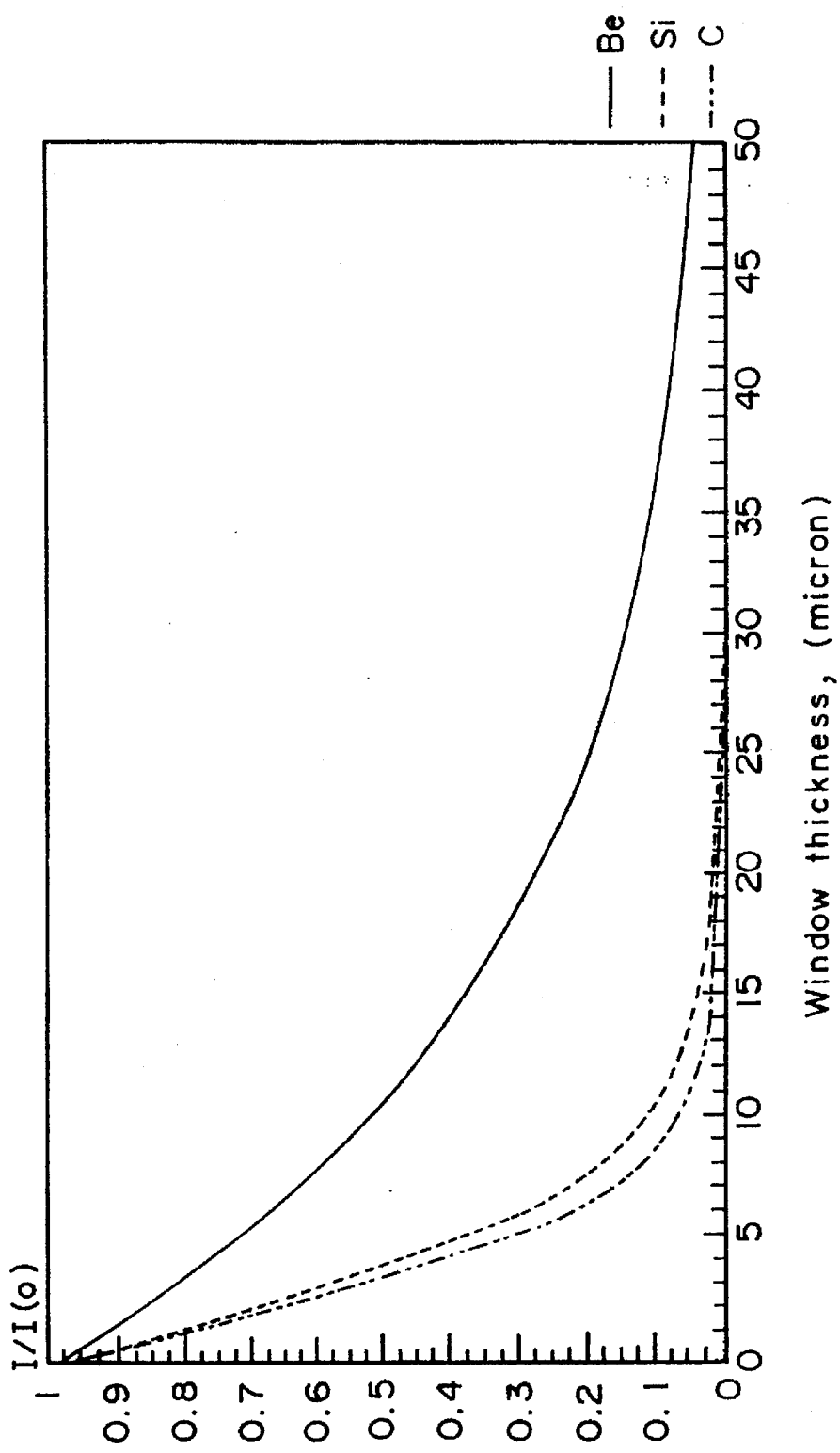
FIG. 4 is a graph of the relative beam transmission as a function of exit window thickness for three different exit window materials.

By providing an exit window 14 having the shape of a cylinder as shown in the cross-sectional view of FIG.2(b), the present invention allows the window to withstand the 14.7 psi pressure differential between the beamline and the exposure chamber and the material to be thin enough to allow the desired energy spectrum through the window while substantially attenuating the energy band above and below the desired range. A preferred material for the thin material 22 of exit window 14 is beryllium having a thickness between 16–25 microns. Other materials that can be used for the thin material 22 include carbon (diamond), silicon, silicon carbide, and silicon nitrite having a thickness between 25–35 microns. Referring now to FIG. 4, there is shown a graph of the relative beam transmission as a function of exit window thickness for three different exit window materials. As shown in FIG. 4, beryllium is preferred since the silicon and carbon exit windows yield lower radiation transmissions and require more intensive cooling and which leads to a lower production throughput. It should be mentioned that the energy not transmitted through the beryllium exit window (mostly undesirable energy) will be absorbed by the beryllium foil. The cylindrical configuration of the material is such that the energy is uniformly received throughout the window. Beryllium foil material is chosen to insure that the energy absorbed will not have much radiative effect and, preferably, will be conducted from the midpoint to the edges so that a temperature rise will not be severe.

In a production X-ray lithography beamline application the exit window size is dictated by the size of the exposure field (chip size). A performance requirement for ESR based XLS is that the exposure field (chip sizes) on a wafer must be 25 mm ×50 mm or larger with wafer diameters of 200 mm. By providing the exit window 14 having the shape described above and, in further view of FIG. 3, the present invention allows the exit window to meet this requirement by allowing the width "a" of opening 26 to be 25 mm or larger and the length "b" of opening 26 to be 50 mm or larger. Width "a" and length "b" additionally represent the respective width and length of an exposure field 31 on a wafer (not shown) in the exposure chamber. In this embodiment, the total width "e" of the cylindrical thin material 22 is 42 mm and the length "f" of the thin material 22 is 120 mm. Thus, the present invention provides an exit window 14 of a cylindrical shape that can be bonded at its peripheral edges to frame 28 in the manner described above, to support a stationary exit window. The cross-section of the X-ray beam scanned over the exit window is typically a few mm in the vertical dimension and 50 mm or wider. In order to fully illuminate the exposure field this beam is scanned over the entire vertical dimension of 25 mm or a stationary beam is used and the target (mask and wafer) is moved relative to the stationary beam. In either case, the present invention allows the exit window to be stationary. This is in marked contrast to prior art exit windows that require a synchronously scanning exit window to be scanned along with the X-ray beam. The stationary exit window of the present invention has a simpler design and operation over scanning exit windows which contribute to a longer lifetime. The stationary window has the advantage that no mechanical movement is required. In addition, no control system is required and the heat load is distributed on a larger surface area.

The present invention is also directed to a method of scanning the X-ray beam emitted from the X-ray lithography beamline onto the exposure field 31 of a wafer (not shown). The method includes the step of positioning a stationary exit window having an opening 26 approximately equal to the exposure field 31 between the beamline and the wafer. The material 22 of the exit window has a cylindrical shape having a thickness and radius of curvature, as dictated by equation 1, above, such that it can withstand a pressure differential of at least 14.7 psi and is transmissive to the desirable energy band. A vacuum is created within the beamline such that there is a pressure differential of at least 14.7 psi between the beamline and the exposure chamber containing the wafer. Next, the X-ray beam is scanned between first and second positions 56, 58, as shown in FIG. 2(a), such that the X-ray beam passes through the exit window 14 and is incident on the exposure field 31 between first and second edges 57, 59 thereof. The X-ray beam as passed through the exit window 14 has X-rays above and below the desired energy band substantially attenuated due to the thickness of the material 22 of the exit window 14.

The beam power transmission variation generated by the beam deflection as a result of the shape of the exit window must be considered. As shown in FIG. 2(a), as the beam scans between first and second positions 56, 58 the beam only contacts the curved surface 60 having a substantially constant surface radius R. The scanned beam approaches the curved surface 60 of middle section at various angles and thus passes through increasing thickness of material 22 as it moves away from the center line 62 (zero deflection) towards the top and bottom of the window. This virtual thickness is a function of the material thickness, the curvature of the surface 60 and the deflection angle "d".

Referring now to FIG. 4, there is shown a graph of the relative beam power transmission variation over one half of the scanned field. It is clear from the graph that a window with a large surface radius R and a small deflection angle are desirable to minimize the virtual thickness and the accompanied beam power transmission variations. However, as explained below, the larger the radius, the higher the hoop stresses and, thus, a compromise must therefore be selected. For example, an exit window with a surface radius $R \geq 2$ inches would require thicker material to reduce the hoop stress.

Although shown and described in what we believed to be the most practical and preferred embodiments, it is apparent that departures from the specific methods and designs described and shown will suggest themselves to those skilled in the art and may be made without departing from the spirit and scope of the invention. We, therefore, do not wish to restrict ourselves to the particular constructions described and illustrated, but desire to avail ourselves of all modifications that may fall within the scope of the appended claims.

What is claimed is:

1. A method of scanning an X-ray beam emitted from an X-ray lithography beamline onto an exposure field on a wafer comprising the steps of:

positioning a stationary exit window having an opening that is approximately equal to the exposure field between said X-ray lithography beamline and said wafer, said exit window having a cylindrical cross-section and a thickness such that said window can withstand a pressure differential of 14.7 psi;

drawing a vacuum within said lithography beamline such that there is a pressure differential of at least 14.7 psi between the X-ray lithography beamline and an exposure chamber containing the wafer; and, scanning the X-ray beam between first and second positions such that the X-ray beam passes through the exit window and is incident on the wafer between first and second edges of the exposure field.

2. The method of scanning an X-ray beam emitted from an X-ray lithography beamline onto an exposure field as claimed in claim 1 wherein the scanning step further includes the step of attenuating X-rays emitted from the X-ray beam as passed through the exit window above and below a predetermined energy band.

3. An x-ray lithography system for manufacturing semiconductor devices comprising:

a preaccelerator;

a beam transport line;

an electron storage ring for generating an x-ray beam;

an exposure chamber for holding a semiconductor wafer to be exposed to the x-ray beam, said semiconductor wafer having an exposure field; and a lithography beamline for connecting the electron storage ring to the exposure chamber having a stationary exit window for sealing the lithography beamline from the exposure chamber, said exit window having:

a frame for mounting the exit window, said frame having an opening;

a thin material disposed within said opening of said frame having a window section, a peripheral section integral with said window section which extends within the frame, and a thickness; and said window section is a cylindrical sector having a radius of curvature such that said thin material can withstand a pressure differential between said x-ray lithography beamline and said exposure chamber of at least 14.7 psi.

4. The x-ray lithography system of claim 3 wherein the opening in said frame of said exit window is slightly larger than a cross-sectional area of the x-ray beam generated by said electron storage ring to allow the exit window to be stationary relative to the x-ray beam.

5. The x-ray lithography system of claim 3 wherein the opening in said frame of said exit window is equal to or larger than the exposure field.

6. The x-ray lithography system of to claim 5 wherein said opening of said exit window is rectangular in shape.

7. The x-ray lithography system of claim 5 wherein said thin material of said exit window has a predetermined thickness to attenuate x-rays above and below a desired energy band.

8. The x-ray lithography system of claim 7 wherein said desired energy band is between 800 and 1800 eV.

9. The x-ray lithography system of claim 7 wherein said thin material of said exit window is beryllium.

10. The x-ray lithography system of claim 9 wherein said thin material of said exit window is formed of beryllium having a thickness ranging from 16 to 25 microns.

* * * * *